United States Patent
Noda

(10) Patent No.: US 7,184,353 B2
(45) Date of Patent: Feb. 27, 2007

(54) SEMICONDUCTOR DEVICE

(75) Inventor: Hiromasa Noda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/287,368

(22) Filed: Nov. 28, 2005

(65) Prior Publication Data
US 2006/0114732 A1 Jun. 1, 2006

(30) Foreign Application Priority Data
Nov. 30, 2004 (JP) ............................. 2004-346447

(51) Int. Cl.
*G11C 17/18* (2006.01)
*G11C 7/00* (2006.01)
*G11C 8/00* (2006.01)

(52) U.S. Cl. .............................. 365/225.7; 365/189.12; 365/194; 365/200; 365/233

(58) Field of Classification Search ............. 365/225.7, 365/189.12
See application file for complete search history.

(56) References Cited

U.S. PATENT DOCUMENTS

| | | | | |
|---|---|---|---|---|
| 5,539,739 A | * | 7/1996 | Dike et al. ................... | 370/352 |
| 5,870,411 A | * | 2/1999 | Durham et al. .............. | 714/724 |
| 5,912,900 A | * | 6/1999 | Durham et al. .............. | 714/724 |
| 7,076,681 B2 | * | 7/2006 | Bose et al. .................. | 713/600 |

FOREIGN PATENT DOCUMENTS

JP    2000-182394    6/2000

OTHER PUBLICATIONS

Jan M. Rabaey, et al, "Digital Integrated Circuits", Prentice Hall, Dec. 2002.

* cited by examiner

*Primary Examiner*—Amir Zarabian
*Assistant Examiner*—Ly Duy Pham
(74) *Attorney, Agent, or Firm*—McGinn IP Law Group, PLLC

(57) ABSTRACT

A semiconductor device capable of exchanging fuse data between registers is provided. Fuse circuits 20 to 24 are respectively connected to register circuits 10 to 14, and output fuse data that is stored in the built-in fuses to the respective register circuits 10 to 14. Register circuits 15 to 19 hold fuse data that is transferred from register circuits 10 to 14, respectively. A logic circuit 30 is connected to the output of the register circuits 15 to 19, and using the data held by the registers 15 to 19, calculated information such as whether or not an externally input address matches a salvage address for salvaging defective bits. Register circuits 10 and 11, 11 and 12, . . . , 17 and 18, 18 and 19 are connected to each other, and fuse data is transferred between adjacent register circuits. When doing this, pairs of adjacent register circuits operate such that data transfer is performed according to self-timing handshake logic.

7 Claims, 11 Drawing Sheets

FIG. 3
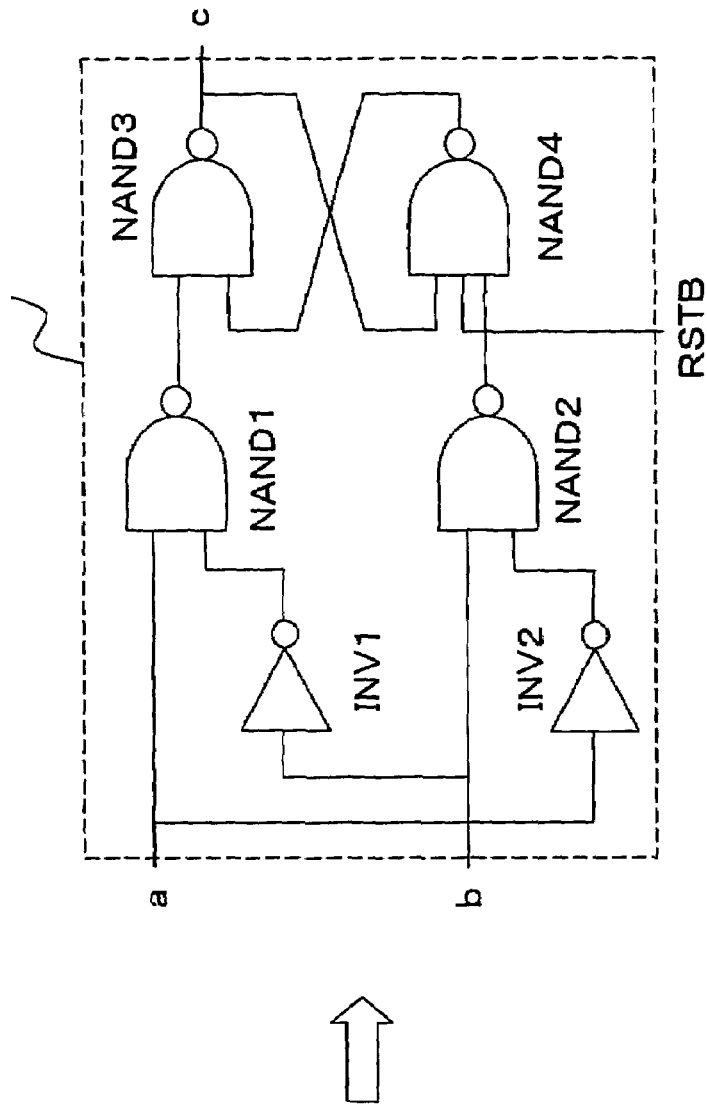
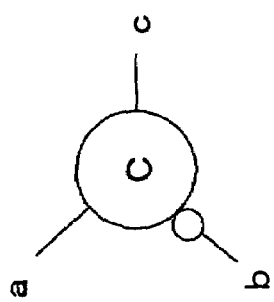

SEMICONDUCTOR DEVICE

FIELD OF THE INVENTION

This invention relates to a semiconductor device, and more particularly to a semiconductor device having a non-volatile memory element such as a fuse.

BACKGROUND OF THE INVENTION

Conventionally, in a semiconductor device comprising a semiconductor memory such as RAM (Random Access Memory), defective bits contained in the memory are salvaged to improve the extraction rate. When doing this, setting the salvage address information for salvaging the defective bits is performed using a programmable fuse or the like. Also, when an externally input address matches the salvage address, the semiconductor device uses a spare memory cell to salvage the defective bits.

Recently, the demand for high-speed memory access of semiconductor memory is ever increasing. One kind of signal propagation path that determines the access speed is a signal path that compares the salvage-address information that is stored in the fuse with an externally input address. In this case, in order to make it possible to increase speed without performing this address comparison, shift redundancy has been proposed. In shift redundancy, a switch is located in the memory-bit selection line, and by shifting the relationship between the selection line and external-input address one by one to the next value, the defective bits are separated from the signal path so it is not necessary to compare addresses.

When salvaging defective bits, in order to more precisely salvage defective bits using the shift redundancy, it is necessary to decrease the size of the salvage unit. As a result, when looking at the entire memory, a very large number of fuses becomes necessary in order to record the number of salvage units and the salvage addresses for each salvage unit. Moreover, the number of signals that are generated from the fuse information for controlling the selection line switch becomes large. Therefore, it is desired that in order to reduce the wiring channels the switch and fuses be adjacent to each other. However, when they are adjacent to each other, the fuses become scattered throughout the entire chip, so the time required for alignment and the like when fuses are turned OFF increases, and the cost for manufacturing the semiconductor-memory device increases.

Therefore, a semiconductor device has been disclosed in Patent Document 1, for example, as a device that comprises means for decreasing the wiring channel. This semiconductor device brings all of the fuses on the chip together in one location, and has a register group next to the fuses that reads the fuse signals, as well as has a register group in a comparison circuit that compares the input address signals with the fuse signals, and is such that both register groups are separated from each other. Also, both register groups are constructed into a daisy chain by having one data-signal line and one clock signal for read/write control of the registers, in order to reduce the number of wiring channels.

[Patent Document 1] Japanese Patent Kokai Publication No. JP-P2000-182394A (FIG. 1)

[Non-patent Document 1] Jan M. Rabaey, et. al, "Digital Integrated Circuits", Prentice Hall, December 2002

SUMMARY OF THE DISCLOSURE

However, in the prior art, exchanging data between registers is controlled by a clock, so care must be taken in order to ensure the exchange of data. For example, oscillator output such that data exchange is activated when the power-ON-reset signal goes OFF is typically used for the clock. In this case, at the instant when the normal power-ON-reset signal goes OFF, there is a possibility that the power-supply voltage will not reach the normal operating voltage level and that the clock will not be in a steady state, so it is necessary to verify whether or not data has actually been exchanged between registers. Also, in order to synchronously transfer data in the registers according to clock signals and to perform operation stably, it is necessary to perform simulation in the design stage under various conditions such as the clock frequency, register placement location, drive capability of the registers, etc. Therefore, there is a problem in that design is not always easy.

It is an object of the present invention to provide a semiconductor device that assures the exchange of fuse data between registers and that is easy to design.

According to one aspect of the present invention, there is provided a semiconductor device as follows.

The semiconductor device comprises: N (N is a natural number) number of fuse circuits having built-in fuses; 1st to Nth register circuits that are respectively connected to the N number of fuse circuits, and that read the fuse data stored in the fuses; Nth+1 to 2Nth register circuits that hold the fuse data that is respectively transferred from the 1st to Nth register circuits; and a logic circuit that is connected to the Nth+1 to 2Nth register circuits, and that performs specified logic operations on the fuse data that is held by the register circuits. A Kth (K is a natural number from 1 to 2N−1) register circuit and a Kth+1 register circuit are connected, and the fuse data is transferred from the Kth register circuit to the Kth+1 register circuit according to self-timing handshake logic.

The meritorious effects of the present invention are summarized as follows.

With this invention, no clock is used, and pairs of register circuits are connected by self-timing handshake logic, so it is possible to exchange fuse data between register circuits without the clock frequency or placement location of the register circuits being regulated. Therefore, it is not necessary to confirm the assurance of data exchange under various conditions.

BRIEF DESCRIPTION OF THE DRAWINGS

FIG. 3 is a circuit diagram showing the construction of a Mueller C unit.

PREFERRED EMBODIMENTS OF THE INVENTION

A semiconductor device of this embodiment of the invention comprises: N number (N=5 in FIG. 1) of fuse circuits (20 to 24 in FIG. 1), 2N number of register circuits (10 to 19 in FIG. 1) and a logic circuit (30 in FIG. 1). The N number of fuse circuits are connected to the 1st to Nth register circuits, respectively, and the data (fuse data) stored in the built-in fuses is output to the respective register circuits. The Nth+1 to 2Nth register circuits hold the fuse data that is transferred from the 1st to Nth register circuits, respectively. The logic circuit is connected to the Nth+1 to 2Nth register circuits, and performs specified logic operations on the data held in each of the register circuits. The Kth register circuit and Kth+1 register circuit are connected, and fuse data is transferred from the Kth register circuit to the Kth+1 register circuit.

In the semiconductor device constructed as described above, the register circuits operate so as to perform data transfer between adjacent register circuits with one another according to handshake logic. In the handshake logic, first, the sending side that sends the data (Kth register circuit) sends a data-send-request signal to the receiving side (Kth+1 register circuit), and the receiving side receives that data-send-request signal, and if it is in a state capable of receiving data, it returns a data-receive signal to the sending side. The sending side receives the data-receive signal and sends data for the first time, and furthermore sends a data-send-end signal to the receiving side. The receiving side receives the data-send-end signal and receives the data, then returns a data-received signal to the sending side. Operation is performed in this kind of sequence so the exchange of data is assured.

Embodiment

Figure 1:
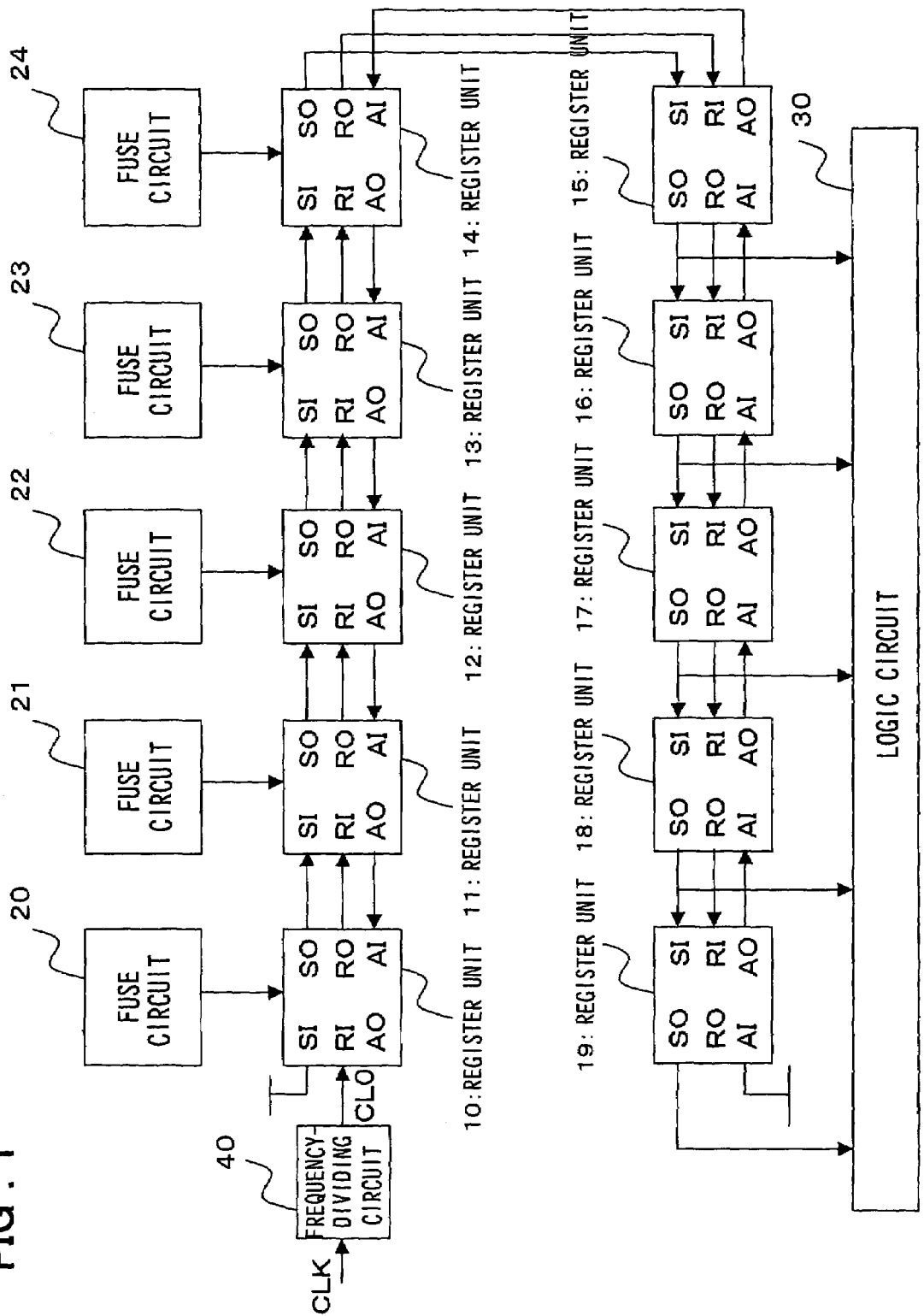
FIG. 1 is a block diagram showing the construction of the semiconductor device of an embodiment of the invention.

FIG. 1 is a block diagram showing the construction of the semiconductor device of an embodiment of this invention. The semiconductor device comprises: register units 10 to 19, fuse circuits 20 to 24, a logic circuit 30 and a frequency-dividing circuit 40. The semiconductor device also comprises various circuits such as circuits related the memory array and reading from or writing to the memory array, however, since they are not related to the present invention, an explanation of them will be omitted.

The number of register units 10 to 19 is just two times the number of fuses (here there are five fuses), and the register units are connected in series. The register units 10 to 14 in the beginning half are connected to the fuse circuits 20 to 24, respectively, and they read the respective fuse information that is input from the fuse circuits 20 to 24, respectively. Salvage information for salvaging defective bit or bits (termed "defective bits", in general, hereinafter) in a memory cell, for example, is stored in advance in the fuse circuits 20 to 24 by performing laser trimming and applying high voltage by programmable electric fuses.

Also, the respective outputs from the register units 15 to 19 in the latter half are each connected to the logic circuit 30, and the logic circuit 30 performs specified logic operations on the contents of the data held in the register units 15 to 19. For example, it calculates information such as whether or not an externally input address matches a salvage address for salvaging defective bits.

An external clock signal CLK that is frequency divided by the frequency-dividing circuit 40 is input as a clock signal CL0 to a terminal RI of the first register unit 10 and is used as a data exchange trigger. The output from an internally located oscillator could also be used as the trigger. Here, the clock signal CL0 is always used as the trigger for the first register unit 10, however, this does not mean that all of the next register units 11 to 19 perform data exchange in synchronization with the clock CL0. In other words, when exchanging data with any of adjacent register units, the register units 10 to 19 function so as to send held data in order (from one to subsequent one, or vice versa) according to handshake logic that does not use an external clock.

Figure 2:
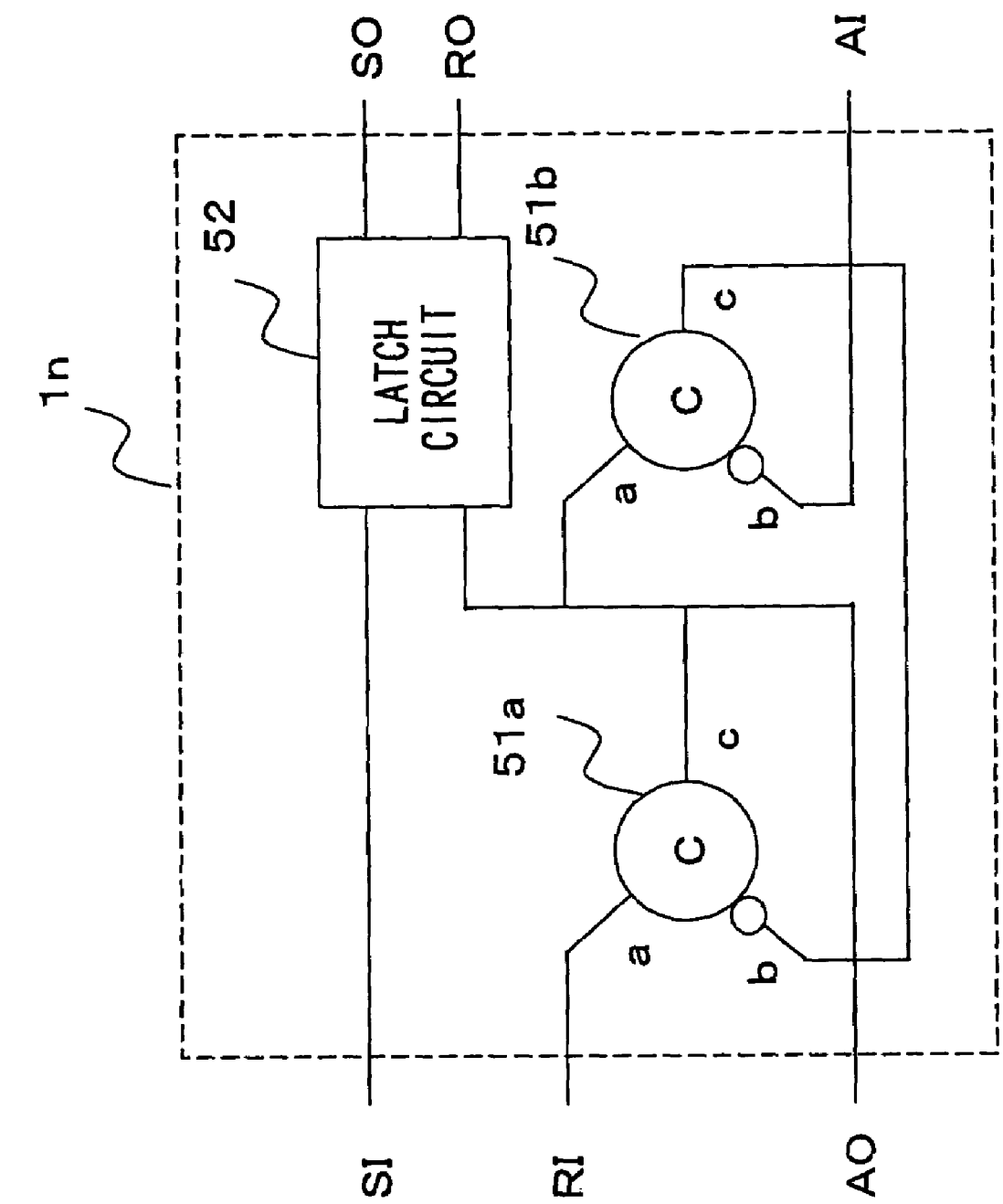
FIG. 2 is a circuit block diagram showing the construction of a register unit.

Next, the construction of the register units 10 to 19 will be explained. FIG. 2 is a circuit block diagram showing the construction of a register unit. The register unit 1n (n=0 to 9) comprises: Muller C units 51a, 51b that are constructed from a kind of flip-flop circuit, and a latch circuit 52. A terminal SI is connected to one of the input terminals of the latch circuit 52. A terminal RI is connected to one of the input terminals 'a' of the Muller C unit 51a. An output terminal c of the Muller C unit 51a is connected to a terminal AO, one of the input terminals 'a' of a next Muller C unit 51b, and the other input terminal of the latch circuit 52. The output terminal c of the Muller C unit 51b is connected to the other input terminal 'b' of the Muller C unit 51a. One of the output terminals of the latch circuit 52 is connected to a terminal SO, and the other output terminal is connected to a terminal RO. Terminal AI is connected to the other input terminal 'b' of the Muller C unit 51b. Here, in order to simplify the explanation, it is not shown in the figures, however, the Muller C units 51a, 51b have a reset terminal RSTB, and the latch circuit 52 has a terminal FUSE that receives input from a fuse, and a reset terminal RSTB. These will be explained later.

FIG. 3 is a circuit diagram showing the construction of a Muller C unit. The Muller C unit comprises: inverter circuits INV1, INV2, and NAND circuits NAND1, NAND2, NAND3, NAND4. The input terminal 'a' is connected to one of the input terminals of the NAND circuit NAND1 and the input terminal of the inverter circuit INV2. Also, the input terminal 'b' is connected to one of the input terminals of the NAND circuit NAND2 and the input terminal of the inverter circuit INV1. The output terminal of the inverter circuit INV1 is connected to the other input terminal of the NAND circuit NAND1, and the output terminal of the inverter circuit INV2 is connected to the other input terminal of the NAND circuit NAND2. The output of the NAND circuit NAND1 is connected to one of the input terminals of the NAND circuit NAND3, the output terminal of the NAND circuit NAND2 is connected to one of the input terminals of the NAND circuit NAND 4, the output of the NAND circuit NAND3 is connected to the other input terminal of the NAND circuit NAND4, and the output terminal of the NAND circuit NAND4 is connected to the other input terminal of the NAND circuit NAND3. Furthermore, the reset terminal RSTB is connected to the other input terminal of the NAND circuit NAND4. A Muller C unit that is constructed in this way functions so that when the levels of the input terminals 'a', 'b' are (H, L), (H, H), (L, L) and (L, H), the level of the output terminal 'c' is H, previous value, previous value and L, respectively. In other words, when the levels of the two input terminals 'a', 'b' are identical, the output level stays at the previous value (remains unchanged). Also, when starting data transfer over from the beginning, the RSTB terminal is used for returning the state of the Muller C unit to the initial state and restarting sending/receiving of data. The Muller C unit (MULLER-C) is explained in Non-Patent Document 1, for example.

Figure 4:
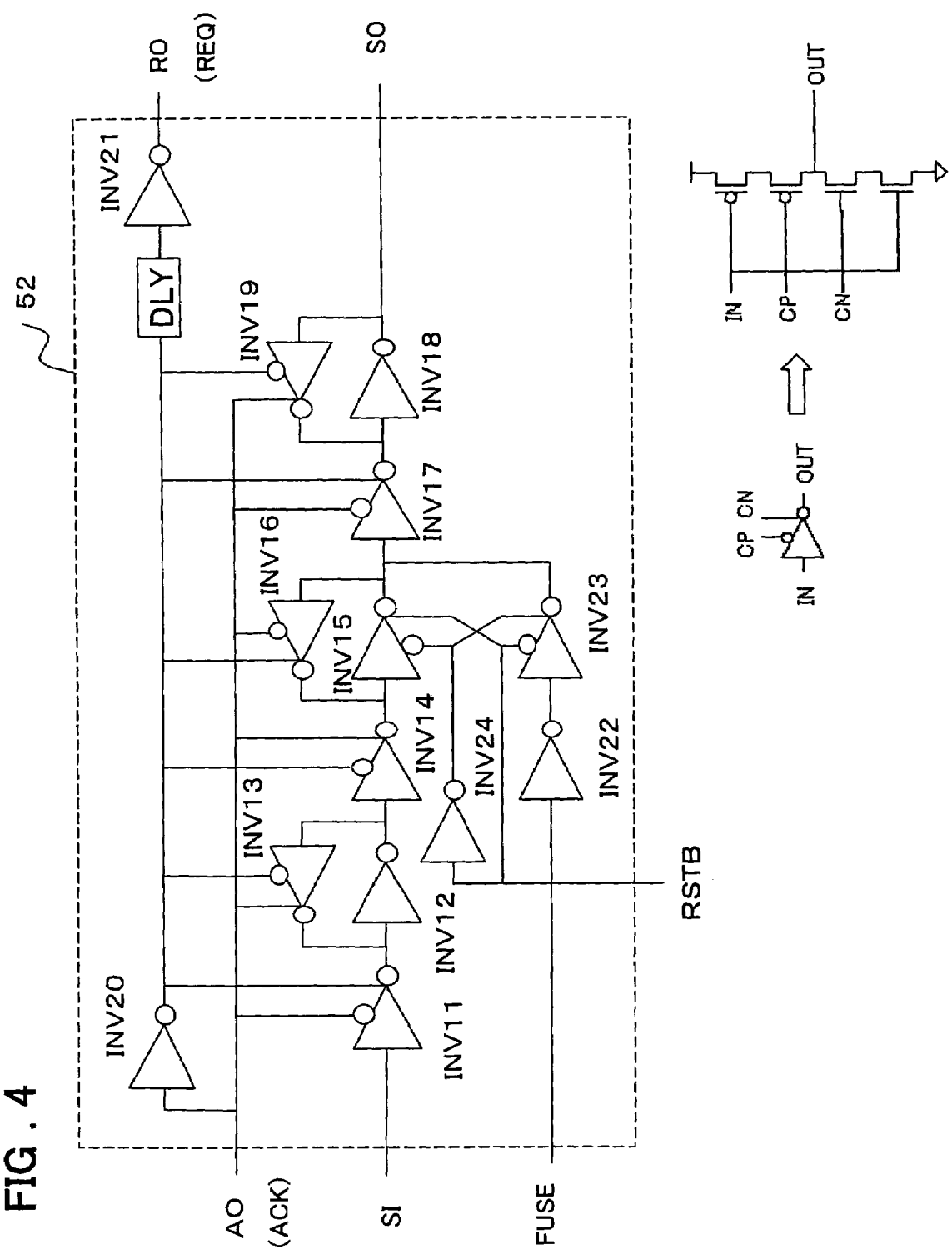
FIG. 4 is a circuit diagram showing the construction of a latch circuit.

FIG. 4 is a circuit diagram showing the construction of the latch circuit 52. The latch circuit 52 comprises inverter circuits INV11 to INV24, and a delay element DLY. The inverter circuits INV11, INV13, INV14, INV15, INV16, INV17, INV19 and IINV23 are inverter circuits that are connected to the Enable terminal, and when the level of the terminal CP is L and the level of the terminal CN is H, the output OUT becomes active. The signal ACK from the terminal AO is inverted by the inverter circuit INV20, and when the level of the signal ACK is L, the inverter circuits INV11, INV16 and INV17 become active, and when the level of the signal ACK is H, the inverter circuits INV13, INV14 and INV19 become active. The inverter circuits INV12 and INV13, inverter circuits INV15 and INV16, and inverter circuits INV18 and INV19 each make up a flip-flop, and each time the signal ACK returns L level or H level, that data is transferred by the respective flip-flop, and transferred from the terminal SI to the terminal SO.

On the other hand, during the period that the level of the signal RSTB is L, the inverter INV23 becomes active without the inverter INV15 becoming active, and the multiplexer constructed from the inverter INV15 and inverter INV23 is switched to the direction (mode) to receive the input signal FUSE from the fuse, so data transfer is not performed. A signal such as a power-ON-reset signal that is generated when the power is turned ON, or a signal for resetting the DLL (Delay Locked Loop) from the outside can be used as the signal RSTB. After the level of the signal RSTB returns to H, data is sent in order (step by step) from the terminal SI to the terminal SO each time the signal ACK is generated. The data-send-request signal REQ that is output from the terminal RO to the latch of the next stage is a signal that, by way of inverter INV20, the delay element DLY and inverter INV21, delays for a fixed period of time the signal ACK that is input from the terminal AO.

Figure 5:
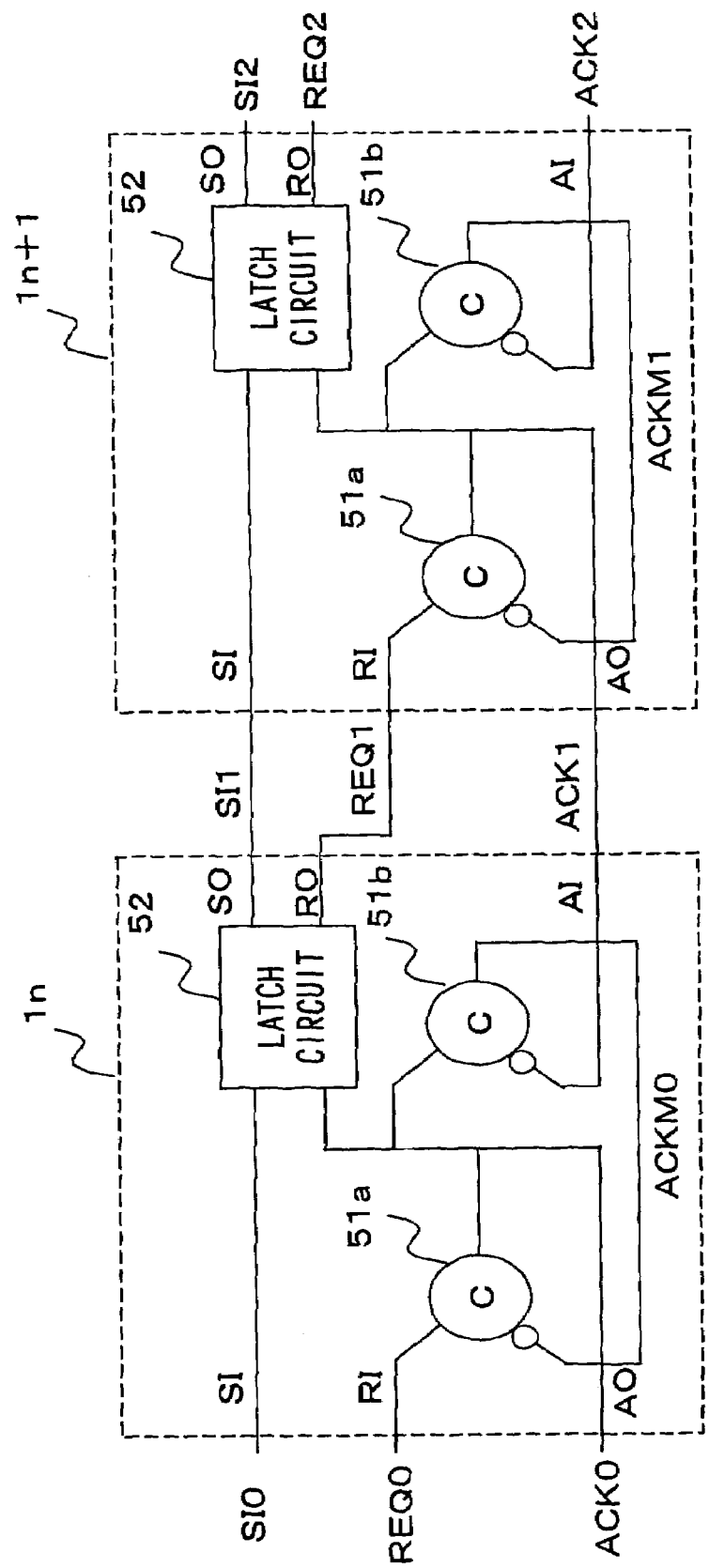
FIG. 5 is a block diagram of the case in which two register units are connected in series.
Figure 6:
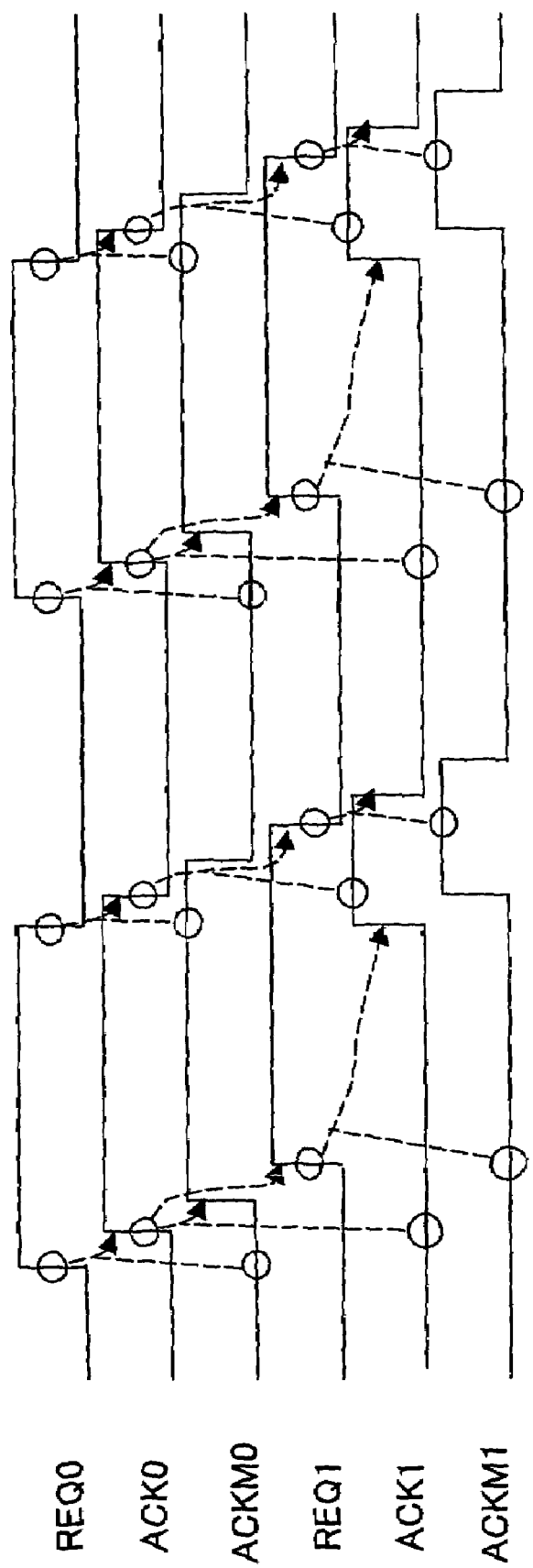
FIG. 6 is a time chart that shows the exchange of signals between two register units.

Next, the method of exchanging data according to the handshake logic of the register units constructed as described above will be explained. FIG. 5 is a block diagram of the case in which the two register units shown in FIG. 2 are connected in series. Also, FIG. 6 is a time chart showing the exchange of signals between two register units. In normal data exchange, when the level of the data-send-request signal REQ0 changes from L to H and the register unit is capable of receiving data, since the level of the signal ACKM0 is L, the level of the data-receive signal ACK0 becomes H (rises), and the data of the signal SI0 is latched by the latch circuit 52. At the same time, receiving data becomes impossible so the level of the signal ACKM0 becomes H. After latching of the data ends, the latch circuit 52 sends a data-send-request signal REQ1 to the next register unit.

When it is possible for the next register unit 1n+1 to receive data, since the level of the signal ACKM1 is L, the level of the data-receive signal ACK1 becomes H, and the data from the terminal SI1 is latched by the latch circuit 52. At the same time, since it becomes impossible to receive data, the level of the signal ACKM1 becomes H. After the level of the signal REQ0 returns to L, the level of the signal ACKM0 is H, so the level of the signal ACK0 returns to L. At this time, since the level of the signal ACK1 is H, the level of the signal ACKM0 returns to L, and it becomes possible to receive the next data. Also, after the level of the signal ACK0 becomes L, the level of the signal REQ1 also returns to L, and the level of the signal ACKM1 returns to L, returning to the initial state.

Figure 7:
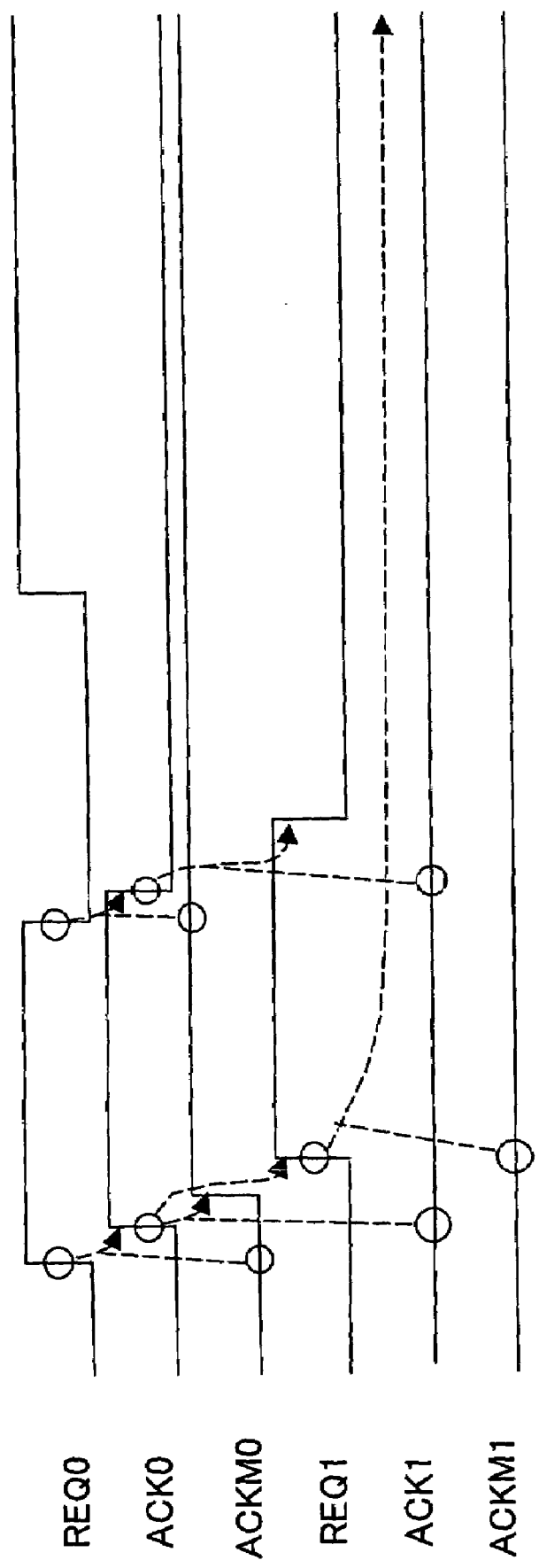
FIG. 7 is another time chart that shows the exchange of signals between two register units.

On the other hand, as shown in FIG. 7, even when the level of the data-send-request signal REQ1 becomes H, the case can be assumed in which for some reason the level of the data-receive signal ACK1 does not return and is fixed at the L level. In this case, the level of the signal ACKM0 is also fixed at the H level, so when the level of the signal REQ0 returns to the L level, a chain reaction occurs so that after that the level is fixed at the L level and transmission of data completely stops. Also, in the step where the level of the signal ACK1 becomes H, operation is such that the transmission of data starts for the first time again.

As described above, the register units 10 to 19 transfer data based on self-timing handshake logic with the adjacent register unit, so data transfer is performed securely.

Figure 8:
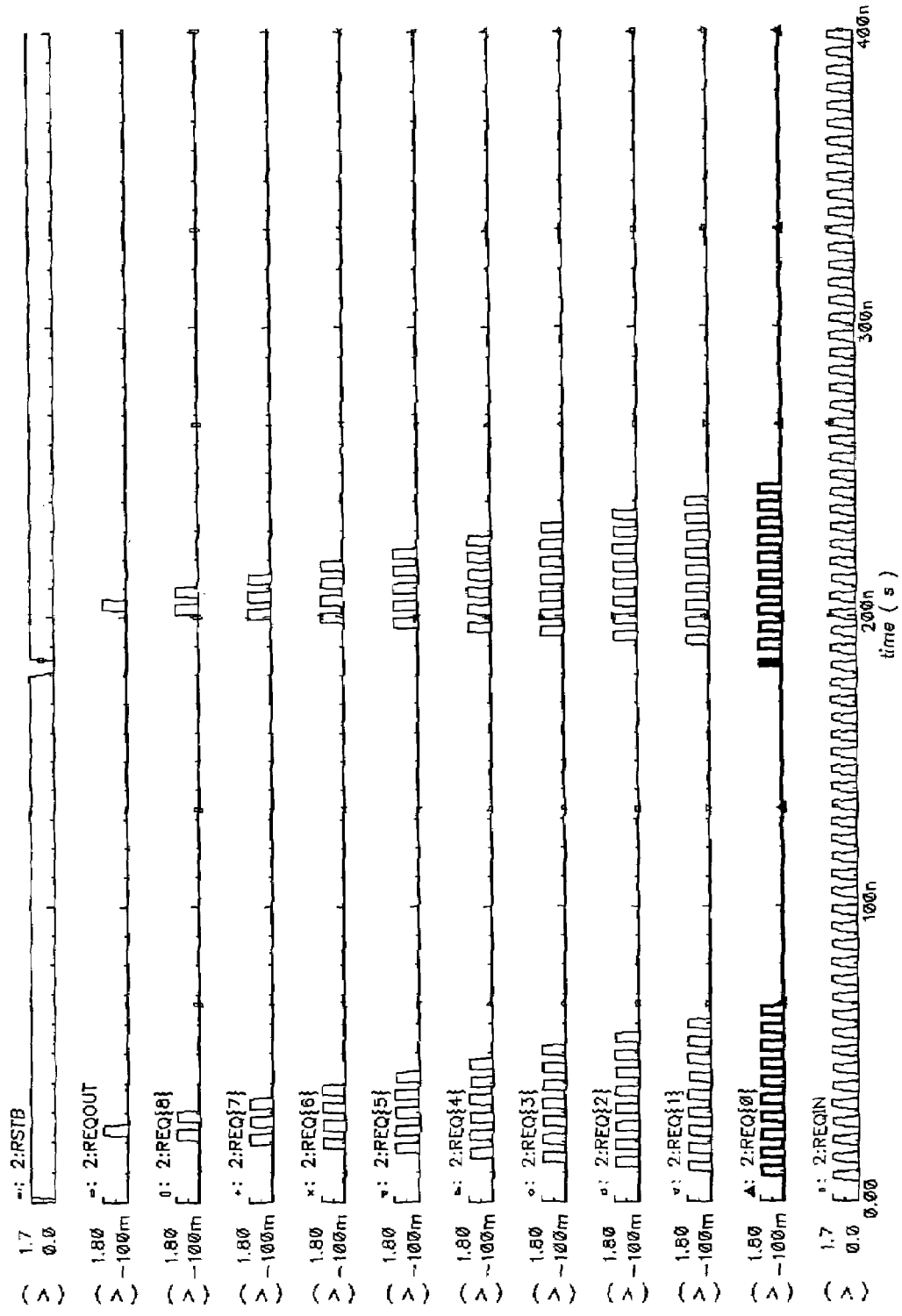
FIG. 8 is a drawing showing the waveform resulting from simulation of a register unit is connected using a 10-stage series connection.

Next, an example of simulation for the case in which register units are connected in a multi-stage series connection will be explained. FIG. 8 is a drawing showing the resulting waveforms of the simulation for the case in which register units are connected in a 10-stage series connection.

In FIG. 8, the signal REQ{n} (n=0 to 8) are the data-send-request signals that are output from the register units, where the signal RE{0} is the first stage, and the signal REQOUT is the signal for the last stage. The signal REQIN is a clock signal obtained by performing frequency division of an external clock, and it is input to the register unit of the first stage. It can be seen that even though the signal REQIN may continuously function as a clock, for each of the REQ signals, the signal REQOUT operates only one time, and the signal REQ{8} operates only 2 times in the final stage, and in the final stage, data transfer stops in order in the stage that data was transferred. Also, by inputting the signal RSTB (by applying a low-level pulse), data transfer begins again.

Figure 9:
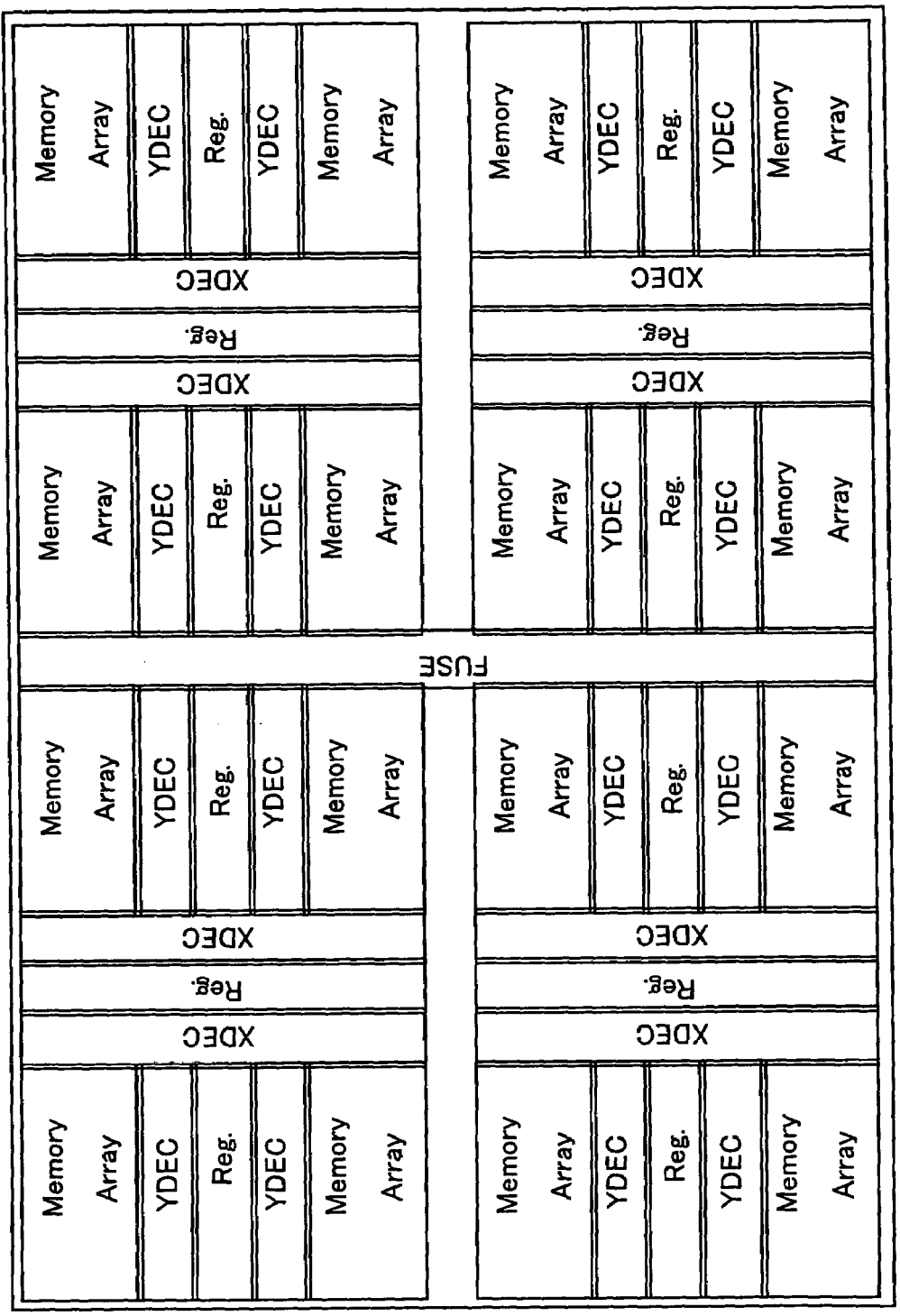
FIG. 9 is a drawing showing the layout of a semiconductor memory when using the fuse data transfer of an embodiment of the invention.

Next, the layout of a semiconductor memory in which this embodiment is applied will be explained. FIG. 9 is a drawing showing the layout of a semiconductor memory for the case in which fuse data transfer is used in this embodiment. In FIG. 9, memory array areas are arranged in 16 locations, and there are X decoder areas XDEC and Y decoder areas YDEC placed near the memory array areas. Also, near the X decoder areas XDEC and Y decoder areas YDEC register areas Reg are placed. The register-unit arrays for transferring the fuse data are arranged in part of the register areas Reg. Moreover, the fuse areas FUSE are collected together into one area in the center of the chip, and the fuse circuits and register-unit arrays connected to the fuse circuits are arranged in the FUSE area. By performing fuse-data transfer based on this embodiment, even though the register areas Reg and fuse area FUSE are in separated locations, by performing data transfer between register units according to handshake logic, it is possible to perform data transfer without any problems. Also, in this invention, since all of the register units are connected in series using handshake logic, it is possible to arrange all of the fuses together in one fuse area FUSE without having an increase in wiring channels. As a result, by reducing the number of times positioning and scan passes, it becomes possible to reduce the time during which the fuses are OFF. Also, by arranging the fuses together in one concentrated area, it is possible to reduce the layout area.

Figure 11:
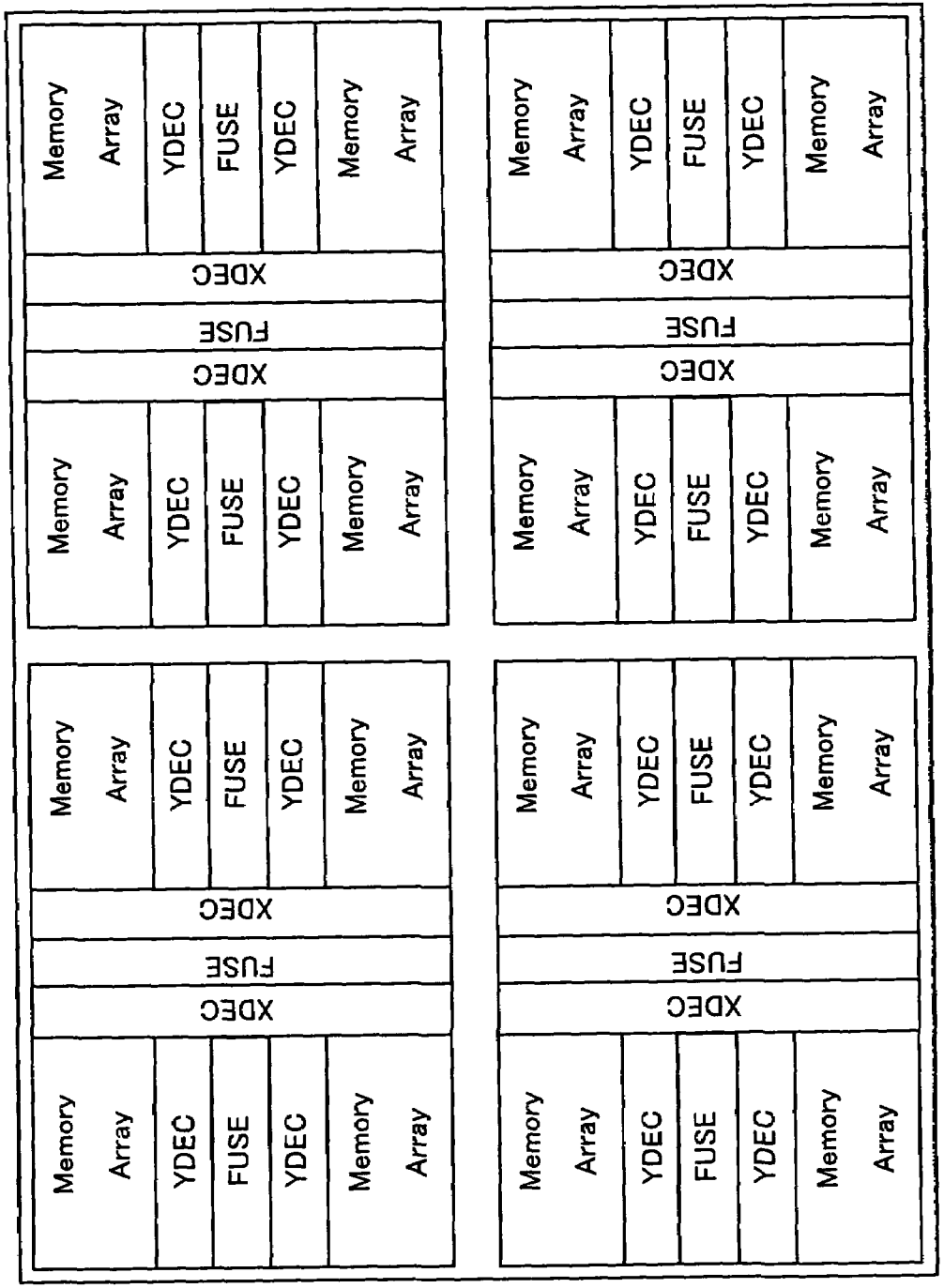
FIG. 11 is a drawing showing the layout of a conventional semiconductor memory in which the fuse area is scattered throughout.

On the other hand, in the case where this invention is not used, in order to reduce the number of wiring channels, fuse areas FUSE are placed directly next to the X decoder areas XDEC and Y decoder areas YDEC as shown in FIG. 11. Therefore, placement is restricted, and together with losing freedom of design, the fuse areas are scattered and the layout area is increased.

Figure 10:
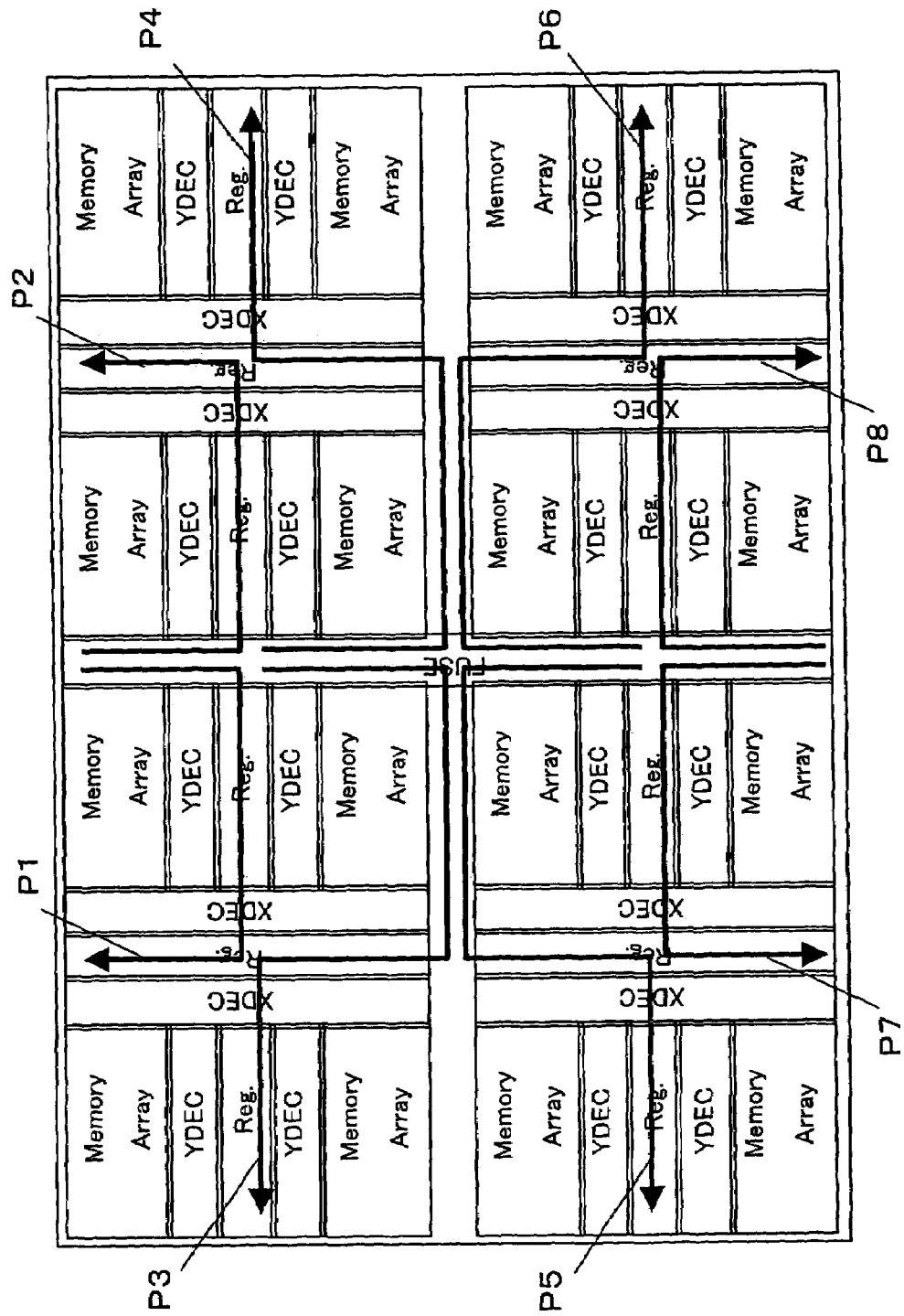
FIG. 10 is a drawing showing an example of placement of the connection paths for register-unit arrays divided into groups.

Incidentally, in the register units explained above, by transferring fuse data within the DLL lock time, it is presumed that it is not necessary for the chip user to take into consideration the time for transferring the fuse data. Therefore, the upper limit of the number of register units that can be connected in series is limited by the lock time. By dividing the register-unit arrays into groups and connecting just the register units inside each group in series, it is possible to end data transfer within a prescribed period of time. FIG. 10 shows an example of the connection path arrangement for register units that have been divided into groups. In FIG. 10, the fuse area FUSE is collected into one location, and the fuse circuits and register units inside the fuse area FUSE are divided into 8 groups, and wiring is drawn along 8 connection paths P1 to P8 and passes through the respective register-circuit-placement areas Reg (areas where register-unit arrays are placed) and connected to specified logic circuits (not shown in the figure). By dividing up and arranging the fuse circuits and register-unit arrays into a plurality of groups in this way, it is possible to perform fuse-data transfer within a specified period of time, such as the DLL lock time.

In the explanation above, an example of shift redundancy was given, however, the technique of this invention can be similarly applied to other fuses, for example, it can also be applied to fuse-data transfer such as in trimming or timing adjustment of the power-supply voltage.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
   N number of fuse circuits having built-in fuses where N is a natural number;
   1st to Nth register circuits that are respectively connected to said N number of fuse circuits, and that read the fuse data stored in said fuses;
   Nth+1 to 2Nth register circuits that hold said fuse data that is respectively transferred from said 1st to Nth register circuits; and
   a logic circuit that is connected to said Nth+1 to 2Nth register circuits, and that performs specified logic operations on said fuse data that is held by the register circuits; wherein
   a Kth register circuit and a Kth+1 register circuit are connected, and said fuse data is transferred from said Kth register circuit to said Kth+1 register circuit according to self-timing handshake logic where K is a natural number from 1 to 2N−1.

2. The semiconductor device of claim 1 having a function whereby
   said Kth register circuit sends a data-send-request signal to said Kth+1 register circuit, and when it receives a data-receive signal from said Kth+1 register circuit that corresponds to said data-send-request signal, it sends said fuse data that it holds to said Kth+1 register circuit, and further sends a data-send-end signal to said Kth+1 register circuit and receives a data-received signal from said Kth+1 register circuit that corresponds to said data-send-end signal.

3. The semiconductor device of claim 2 having a function whereby
   when said Kth+1 register circuit receives said data-send-request signal from said Kth register circuit, it returns said data-receive signal to said Kth register circuit when conditions are such that said fuse data can be received, and when it receives said data-send-end signal, it receives said fuse data and holds it, then returns said data-received signal to said Kth register circuit.

4. The semiconductor of claim 1 wherein transfer of the fuse data held by said 1st register circuit to said Nth+1 register circuit is performed during a Delay Locked Loop DLL lock cycle after power-supply is started.

5. The semiconductor device of claim 1 comprising: said N number of fuse circuits, said 1st to 2Nth register circuits, and said logic circuit in a plurality of groups such that said fuse data is transferred according to said self-timing handshake logic for each respective group.

6. The semiconductor device of claim 1 wherein
   said fuses store salvage-address information corresponding to defective bit or bits contained in memory; and
   said logic circuit calculates the address information for salvaging said defective bit or bits for an externally input address based on said salvage-address information.

7. The semiconductor device of claim 5 wherein
   said fuses store salvage-address information corresponding to defective bit or bits contained in memory; and
   said logic circuit calculates the address information for salvaging said defective bit or bits for an externally input address based on said salvage-address information.

* * * * *